US011282581B1

(12) United States Patent
Chen et al.

(10) Patent No.: US 11,282,581 B1
(45) Date of Patent: Mar. 22, 2022

(54) 3D MEMORY PROGRAM DISTURBANCE IMPROVEMENT

(71) Applicant: MACRONIX INTERNATIONAL CO., LTD., Hsinchu (TW)

(72) Inventors: Han-Sung Chen, Hsinchu (TW); Chien-Fu Huang, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/140,825

(22) Filed: Jan. 4, 2021

(51) Int. Cl.
*G11C 16/04* (2006.01)
*G11C 16/34* (2006.01)
*G11C 16/10* (2006.01)
*G11C 16/08* (2006.01)

(52) U.S. Cl.
CPC ...... *G11C 16/3427* (2013.01); *G11C 16/0483* (2013.01); *G11C 16/08* (2013.01); *G11C 16/10* (2013.01)

(58) Field of Classification Search
CPC . G11C 16/3427; G11C 16/0483; G11C 16/08; G11C 16/10
USPC .................................................... 365/185.02
See application file for complete search history.

(56) References Cited

U.S. PATENT DOCUMENTS

| 10,741,262 B2* | 8/2020 | Lin ........................ G11C 16/08 |
| 10,748,926 B2* | 8/2020 | Nishikawa ............ G11C 16/08 |
| 10,910,060 B1* | 2/2021 | Wu ........................ G11C 16/32 |
| 11,043,280 B1* | 6/2021 | Prakash .............. G11C 11/5671 |
| 11,158,384 B1* | 10/2021 | Yabe ................. H01L 27/11565 |
| 2016/0049201 A1 | 2/2016 | Lue et al. |
| 2020/0118630 A1 | 4/2020 | Lin et al. |

* cited by examiner

*Primary Examiner* — Tha-O H Bui
(74) *Attorney, Agent, or Firm* — Andrew L. Dunlap; Haynes Beffel & Wolfeld LLP

(57) ABSTRACT

A memory device has a plurality of blocks of memory cells and a plurality of bit lines, each block including a group of word lines, and a set of NAND strings. Each block in the plurality of blocks of memory cells has a plurality of sub-blocks, each sub-block including a distinct subset of the set of NAND strings of the block selected, and a respective sub-block string select line. Control circuits are configured to execute a program operation including applying word line voltages and string select line voltages at a precharge level to precharge the set of NAND strings in the selected block, then lowering the gate voltages on all the sub-block string select lines of the block, and then lowering the word line voltages on the group of word lines. Thereafter, the program of cells in a selected sub-block is executed.

18 Claims, 11 Drawing Sheets

3D MEMORY PROGRAM DISTURBANCE IMPROVEMENT

BACKGROUND

Field

The present invention relates to operation of 3D memory, including 3D NAND flash memory, including program operations with reduced disturbance of unselected memory cells.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit.

The density of configurations that enable high capacity and high throughput can, however, result in problems of yield and endurance of the memory cells. Accordingly, it is desirable to provide technologies that can improve yield and endurance while maintaining high density memory structures.

SUMMARY

A technology is described that can suppress unwanted charge trapping in string select gates in a NAND memory device. The technology can be implemented for a NAND memory device having a block and sub-block architecture, in which all the NAND strings in a block share a group of word lines, and sub-blocks of the block include distinct subsets of NAND strings selected by a respective string select line.

A memory device is described comprising a plurality of blocks of memory cells and a plurality of bit lines, each block including a group of word lines, and a set of NAND strings having string select gates for connection to corresponding bit lines in the plurality of bit lines, and in which each NAND string in the set of NAND strings of the block is connected to the group of word lines. Each block in the plurality of blocks of memory cells has a plurality of sub-blocks, each sub-block including a distinct subset of the set of NAND strings of the block, and the distinct subset of NAND strings in each sub-block is operatively connected to a respective sub-block string select line by which gate voltages are applied to the string select gates of the NAND strings in the distinct subset of the sub-block. Control circuits are configured to execute a program operation for the plurality of blocks, the program operation including:

applying word line voltages at precharge levels to the group of word lines of a selected block, and a gate voltage having a first voltage level to all the sub-block string select lines in a selected block to precharge the set of NAND strings in the selected block, then lowering the gate voltage on all the sub-block string select lines of the block, and then lowering the word line voltages on the group of word lines; and after lowering the word line voltages on the group of word lines, applying a bias sequence to program selected memory cells in a selected sub-block, the bias sequence including setting the sub-block string select lines to a selected string level or an unselected string level, and setting the bit lines.

Embodiments of the technology are described adapted for 3D vertical NAND memory.

Operating methods are described to suppress unwanted charge trapping as described herein.

Other aspects and advantages of the present invention can be seen on review of the drawings, the detailed description and the claims, which follow.

DETAILED DESCRIPTION

A detailed description of embodiments of the present invention is provided with reference to the FIGS. 1-12.

Figure 1:
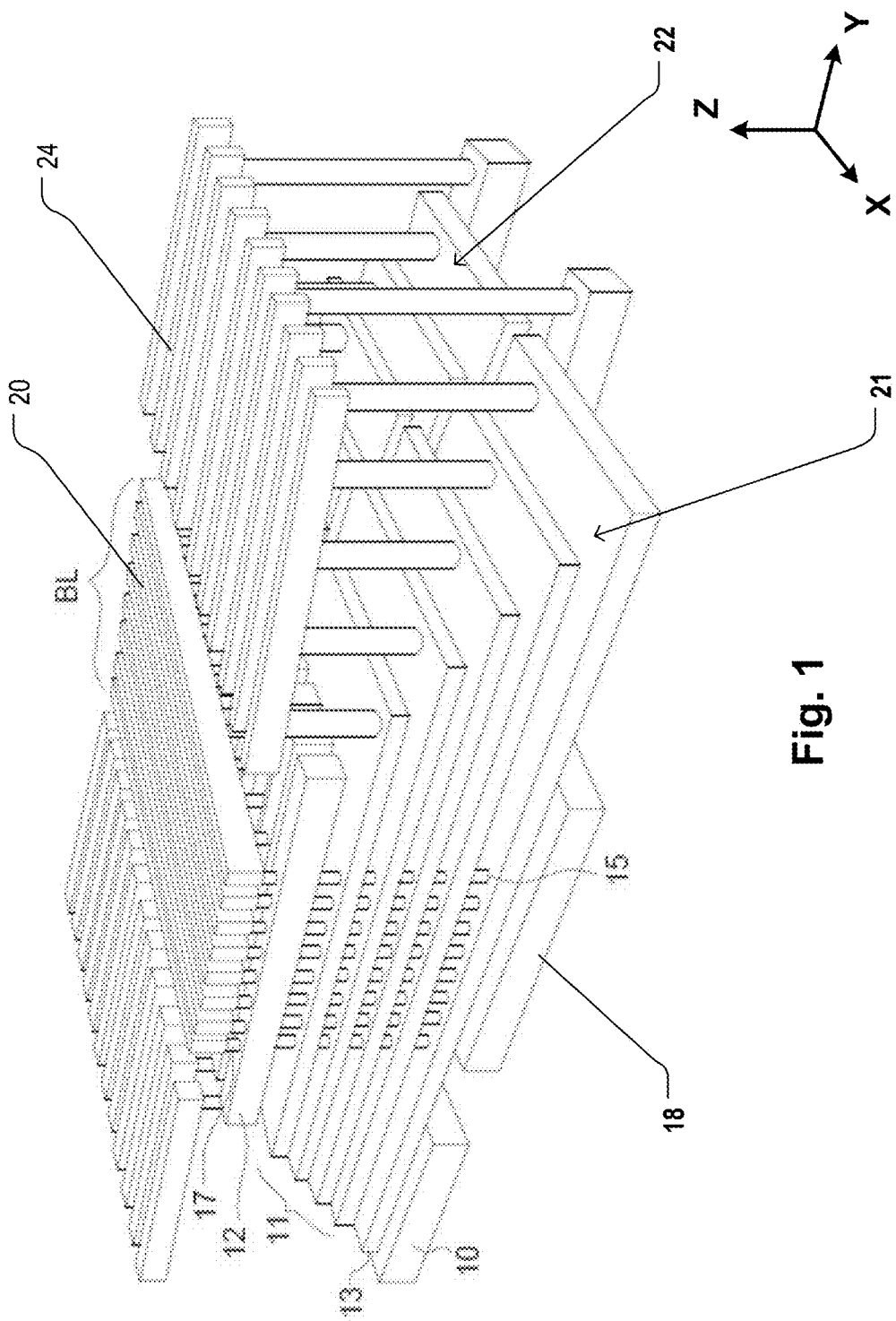
FIG. 1 is a perspective view of a 3D semiconductor device

FIG. 1 is a perspective view of a 3D semiconductor device including a plurality of blocks and sub-blocks of memory cells in a plurality of vertical NAND strings. It comprises a multilevel stack of word line layers 11 configured as a first stack 21 of word lines and a second stack 22 of word lines, each parallel to the substrate 10, and a plurality of pillars (e.g. 15, 17) oriented orthogonally to the substrate arranged in rows and columns. Each of the pillars comprises semiconductor bodies providing channels of a plurality of series-connected memory cells located at cross-points between the pillars and the word lines. The word lines 11 are arranged in a stair step pattern adjacent the blocks of pillars, each step including a contact to an overlying word line conductor 24, which connects to word line driver circuits. A plurality of string select lines (SSLs) 12 is oriented parallel to the substrate and above the word line layers 11. In this example, first and second blocks of memory cells are formed in the first stack 21 and in the second stack 22, respectively. Each of the string select lines intersects a respective distinct subset (e.g. row) of the set of pillars in a corresponding block, where each sub-block of memory cells in the corresponding block is formed in the distinct subset of pillars coupled to a respective string select line.

The structure also includes a plurality of parallel bit line conductors 20 in a layer parallel to the substrate and above the string select lines. Each of the bit line conductors superposes a respective column of the pillars in the array of rows and columns of pillars, each column including one pillar in each set of pillars for each string select line.

Each intersection of a pillar and a string select line defines a select gate of the pillar for connection to a corresponding bit line. Each of the pillars underlies and is coupled by the select gate of the pillar to one of the bit line conductors.

Lower select lines (lower SG) 13 are formed under the word line layers 11 to couple the pillars to one or more source lines such as a common source conductor 18. The common source conductor can be connected to bias circuitry by vertical connections between the blocks, or otherwise.

The structure of FIG. 1 is one example of a memory including a plurality of blocks of memory cells and a plurality of bit lines, each block including a group of word lines (i.e. a stack in FIG. 1), and a set of NAND strings having string select gates for connection to corresponding bit lines in the plurality of bit lines, and in which each NAND string in the set of NAND strings of the block is connected to the group of word lines. Also, it is an example of a memory in which each block in the plurality of blocks of memory cells has a plurality of sub-blocks, each sub-block including a distinct subset of the set of NAND strings of the block. Also, in this example, the distinct subset of NAND strings in each sub-block is operatively connected to a respective sub-block string select line by which gate voltages are applied to the string select gates of the NAND strings in the distinct subset of the sub-block.

Figure 2:
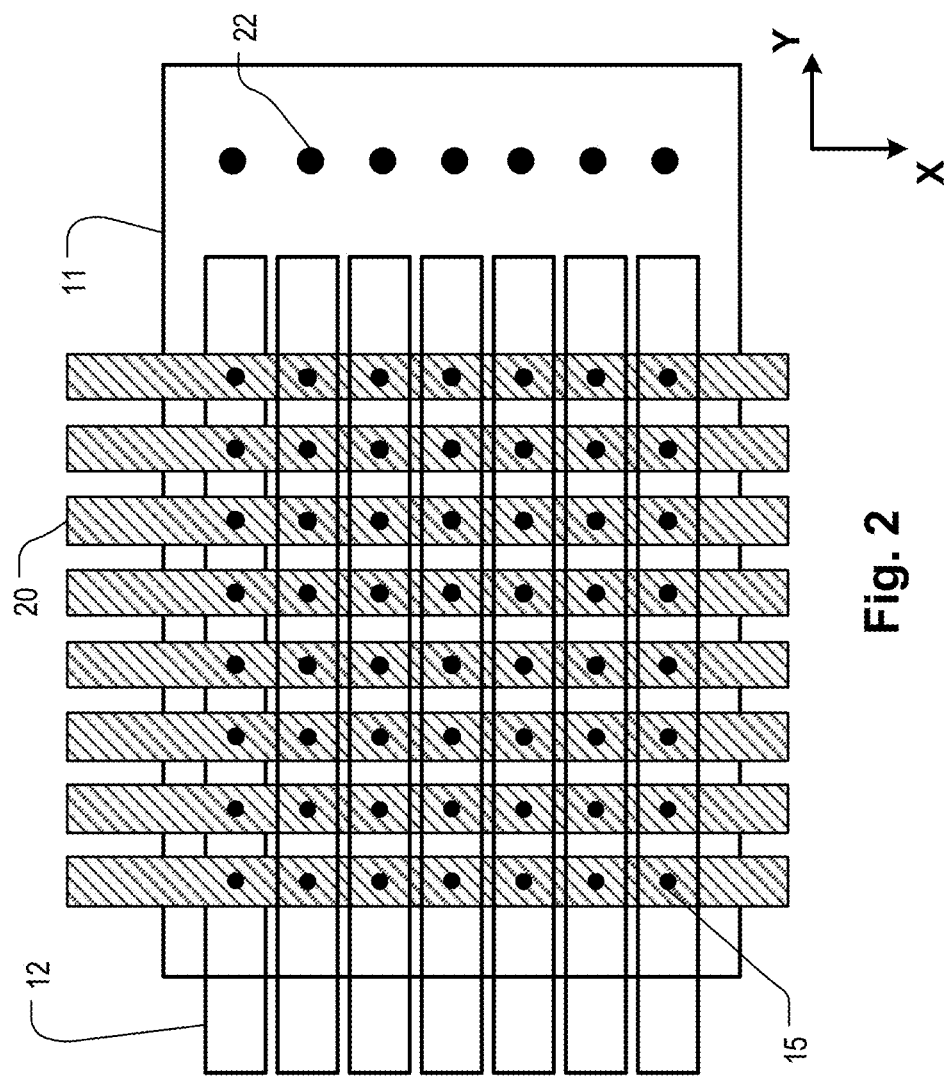
FIG. 2 is a top view of a portion of the structure of FIG. 1.

FIG. 2 is a top view illustrating implementation of a block of memory cells in the structure of FIG. 1. It can be seen in both figures that the stacks 21, 22 of word line layers 11 intersect some of the pillars in the overall structure. Thus, to read data from a particular block of the memory, control circuitry activates a word line in a selected stack 21 to select a block of cells and a particular layer of the stack, and further activates a sub-block string select line 12 to select a particular sub-block. A lower select gate (not shown) is activated as well. Cells on a selected word line in the set of NAND strings of a selected sub-block can then be read out in parallel via the bit line conductors 20 into a page buffer (not shown). ("Activate", as used herein, means to apply a particular bias so as to give effect to the connected cells or switches. The bias may be high or low, depending on the operation and the memory design.)

Figure 3:
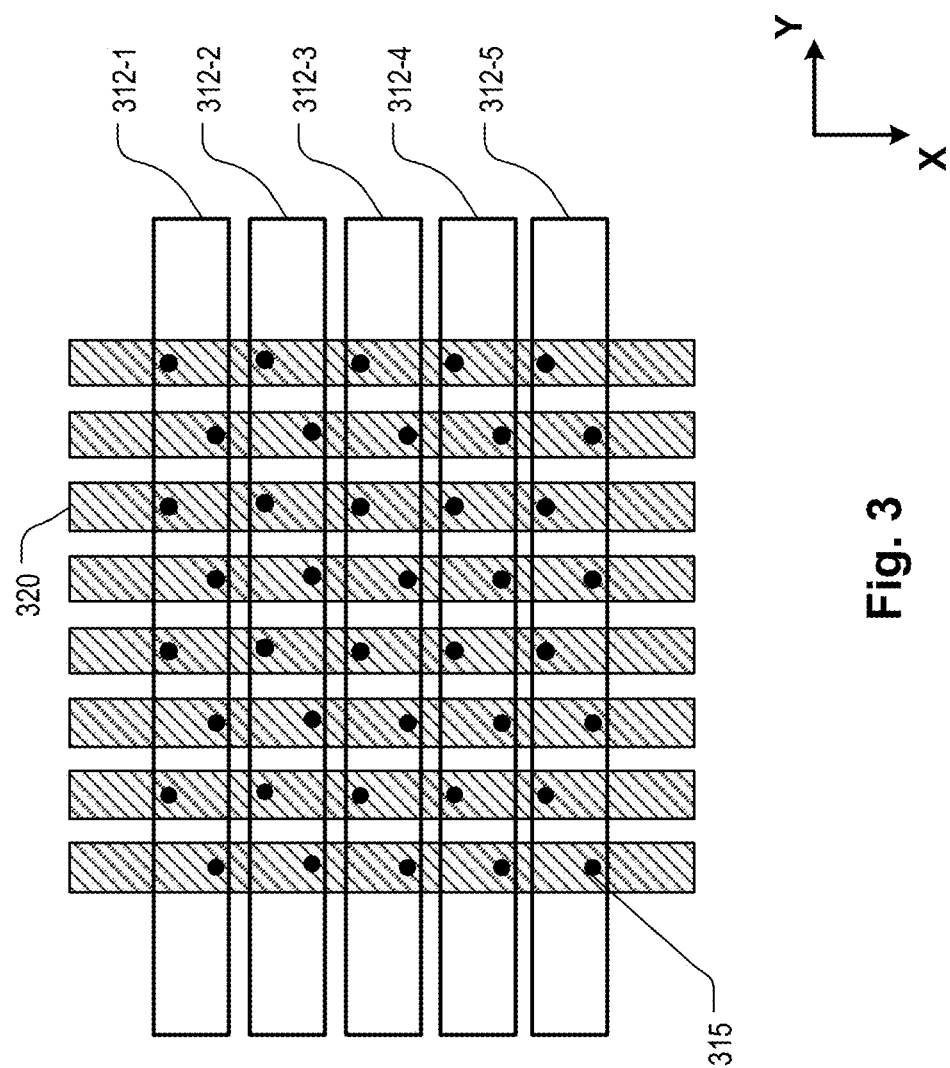
FIG. 3 is a top view of an alternative arrangement of sub-blocks in a block of memory cells.

FIG. 3 is a top view illustrating an alternative arrangement of the sets of NAND strings of the sub-blocks, in which string select lines 312-1 to 312-5 are coupled to respective distinct subsets of pillars (e.g. 315) arranged in offset rows, so that each distinct subset of pillars comprises two rows of pillars. Each dot in FIG. 3 represents the lateral position of a corresponding pillar 315. Five string select lines 312-1 through 312-5 are shown, as are eight bit line conductors 320.

As with the structure of FIG. 2, each of the string select lines 312 in FIG. 3 intersects a respective distinct subset of the pillars 315, the intersections defining string select gates. Similarly, each of the bit line conductors 320 superposes pillars 315 in a respective column, and each of the pillars 315 underlies one of the bit line conductors 320. In the structure of FIG. 3, however, while the pillars form rows oriented orthogonally to the bit lines, the pillars in each such row intersect every other bit line, and alternating rows are shifted so as to intersect alternating sets of the bit lines. Using this configuration, the number of pillars in a sub-block and the density of bit line conductors 320 can be increased, enabling higher capacity and increased throughput for memory operations.

Figure 4:
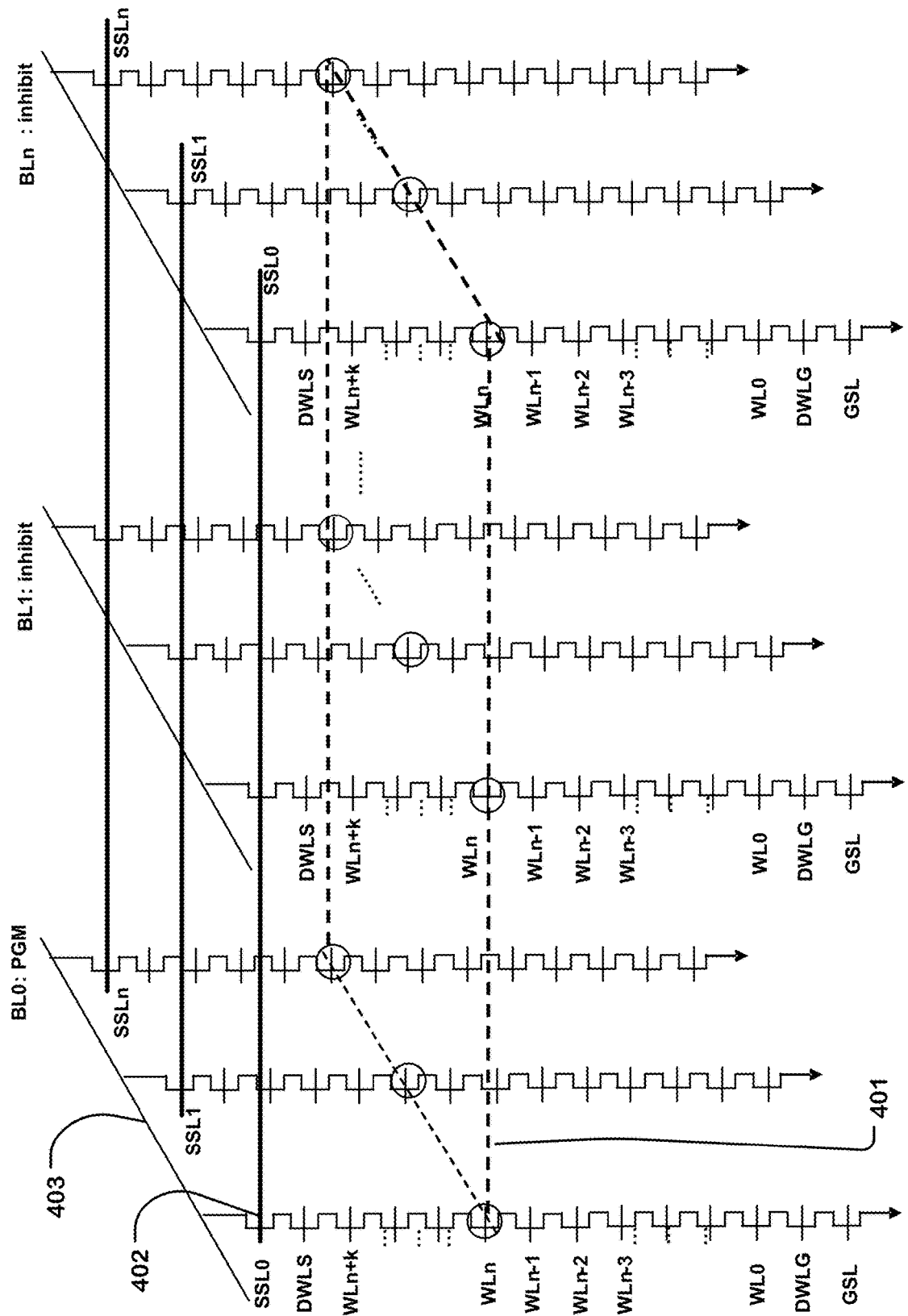
FIG. 4 is a schematic circuit diagram of a block of memory cells in a 3D NAND structure, which can be implemented using a variety of structures, such as those described above.

FIG. 4 is a schematic diagram of a block of memory cells in a 3D NAND device which can comprise many blocks, and in which a block includes a plurality of sub-blocks. In the schematic, a plurality of bit lines BL0 to BLn overlies an array of NAND strings arranged in rows and columns. Each of the NAND strings comprises a series-connected string of memory cells, such as dielectric charge trapping memory cells between a corresponding bit line and a reference line such as the common source line (represented by the ground symbol in FIG. 4). In some embodiments, the common source line for a block can be implemented as one or more reference lines, and may be coupled to biasing circuitry by which operating voltages other than ground are applied in various operations of the memory.

In a 3D NAND arrangement, the set of NAND strings of the block shown in FIG. 4 correspond with pillars of FIGS. 1-3, for example. The NAND strings of the plurality of NAND strings are coupled with a corresponding stack of word lines WL0 to WLn+k, in this example. At word line WLn, the planar structure of each of the word line layers is represented by the dashed line 401. Thus, all the memory cells in the block at the level of a given word line, such as WLn, in the block are coupled to that given word line, such as WLn.

Also, each of the NAND strings includes a corresponding sub-block string select gate (e.g. 402) configured to connect the NAND string to a particular bit line (e.g. 403) in the plurality of bit lines. The select gates can be implemented by transistors that include charge trapping dielectric layers as for example a gate dielectric, which can be the same charge trapping structure as used in the memory cells in the NAND strings. The charge trapping dielectric layers of the string select gates can trap charge as a result of fields created during memory operations, causing undesirable increases in the threshold voltages of the string select gates.

A plurality of sub-block string select lines SSL0 to SSLn are operatively coupled to respective sets of NAND strings, where each set of NAND strings includes a sub-block of the block of memory cells, to apply gate voltages to the sub-block string select gates.

Also, each of the NAND strings includes a corresponding lower select gate configured to connect the NAND string to the common source line or one of the one or more reference lines used to implement the common source line. A lower select gate layer GSL is coupled to all the lower select gates for the NAND strings in the block in this example. In another example, there can be a plurality of lower select gate lines arranged for connection to the lower select gates in the block.

In this example, a lower dummy word line DWLG lies between the lower select gate layer GSL and the lowest word line layer WL0, and an upper dummy word layer DWLS lies between the string select lines SSL0 to SSLn and the uppermost word line layer WLn+k.

In the circuit of FIG. 4, in order to select a particular memory cell in the block, a sub-block is selected by a sub-block string select line which connects each NAND string in the selected sub-block to a respective bit line in the plurality of bit lines, and a word line layer is selected which selects one memory cell at the level of the selected word line on each NAND string in the selected sub-block. The selected memory cell is selected by selecting one bit line corresponding to the NAND string in which the selected memory cell is located. This arrangement enables activation of a plurality of memory cells in parallel, one in each of the NAND strings of the selected sub-block, via its corresponding bit line and word line layer.

Figure 5:
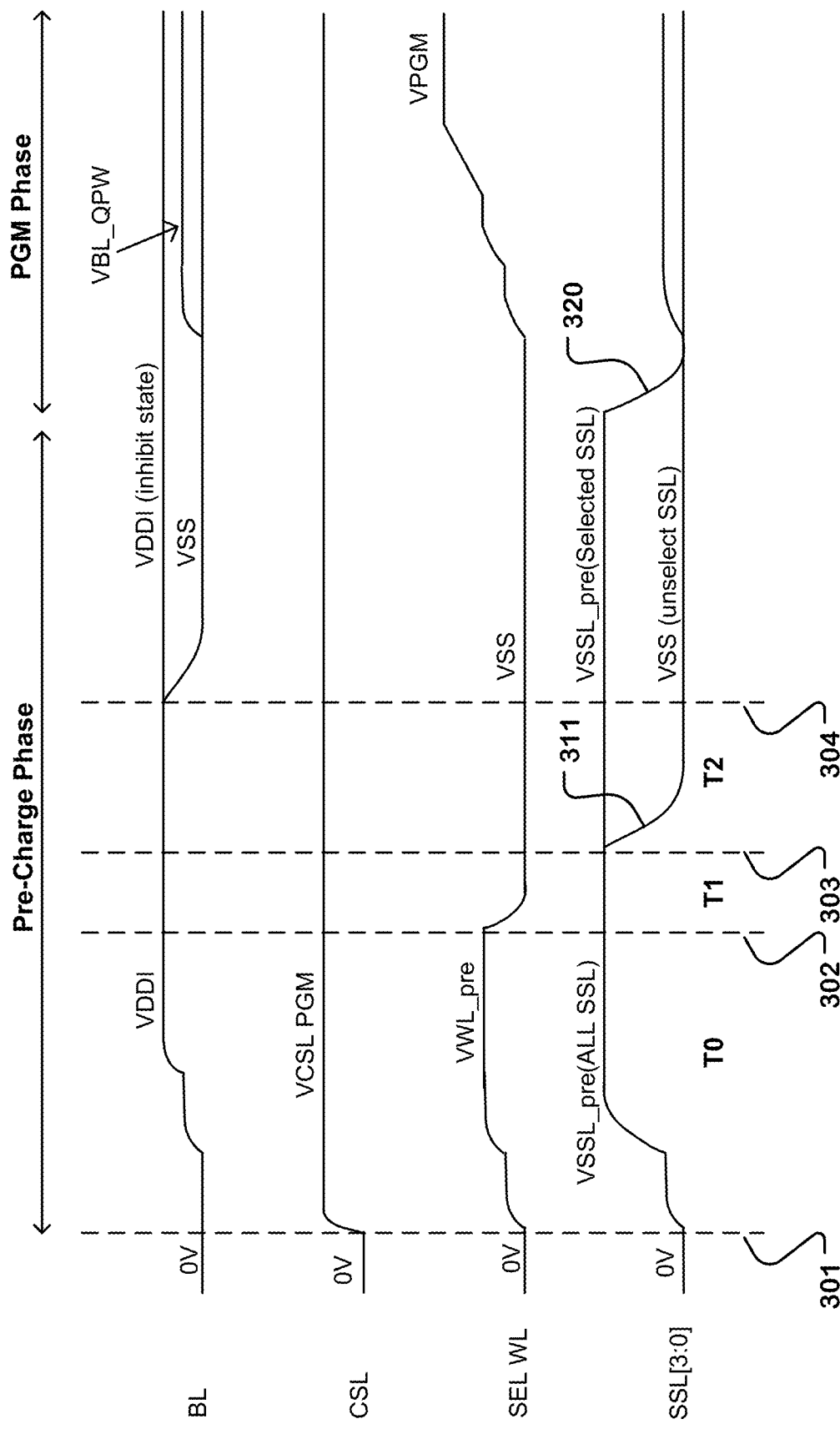
FIG. 5 is a timing diagram for a program operation on a NAND string, such as a NAND string in the circuit shown in FIG. 4.

FIG. 5 is a timing diagram of bias voltages for a program operation in a block of memory cells like that of FIG. 4. The timing diagram shows bit line voltages BL, common source line voltage CSL, the selected word line voltage SEL WL and, assuming there are four sub-blocks, the voltages for the four sub-block string select lines SSL[3:0]. The program operation can be characterized as including a precharge phase and a program phase.

The precharge phase starts at point 301, at which the voltages are grounded in this example. After point 301, the common source line voltage increases to a program precharge level VCSL PGM, the selected word line increases in two steps to a word line precharge level VWL_pre, and all of the string select lines for the block increase in two steps to a string select line precharge level VSS_pre. These voltage shifts turn on the string select line and word lines of the NAND strings in the block, and then the voltage on the bit lines of the block are charged in two steps to a precharge voltage VDDI. After an interval T0, at time 302 the word line voltages are lowered to VSS in the interval T1. At the end of interval T1, at time 303, the string select lines for unselected sub-blocks are reduced to VSS, while the string select lines for the selected sub-block remain at the precharge voltage level VSSL pre. Therefore, in interval T2, the voltage on the unselected string select line falls as indicated at 311, after the voltage on the word lines is dropped to VSS.

Next beginning at time 304, voltages on the bit lines are set according to the data pattern to be programmed in the sub-block to program or inhibit voltage levels. Bit lines to receive the program bias are set to VSS in this example, and bit lines that are to be biased to inhibit programming are set to VDDI or another inhibit voltage.

During the interval T2, the semiconductor body for by the pillars in a vertical NAND string of the pillars in the unselected sub-blocks are precharged, and held at the precharge level by turning off the string select gates for those sub-blocks. For the selected sub-block, the string select gate remains on, while the bit line biases are adjusted according to the data pattern as mentioned above.

At the beginning of the program phase, the string select line for the selected sub-block is lowered as indicated at 320 from the precharge level to an initial level to be used in the programming phase for a selected sub-block. The string select line for unselected sub-blocks is set to VSS or another level to turn off the string select gates. Then, the selected word line voltage increases stepwise in this example to a program voltage level VPGM, the string select gate is controlled to a program level, and the bit line voltage for the pillars in the not inhibited condition can be controlled along with the word line voltage to achieve a programming operation. For example, in a quick pass program operation the bit line voltages may be increased to a VBL_QPW level.

Figure 6:
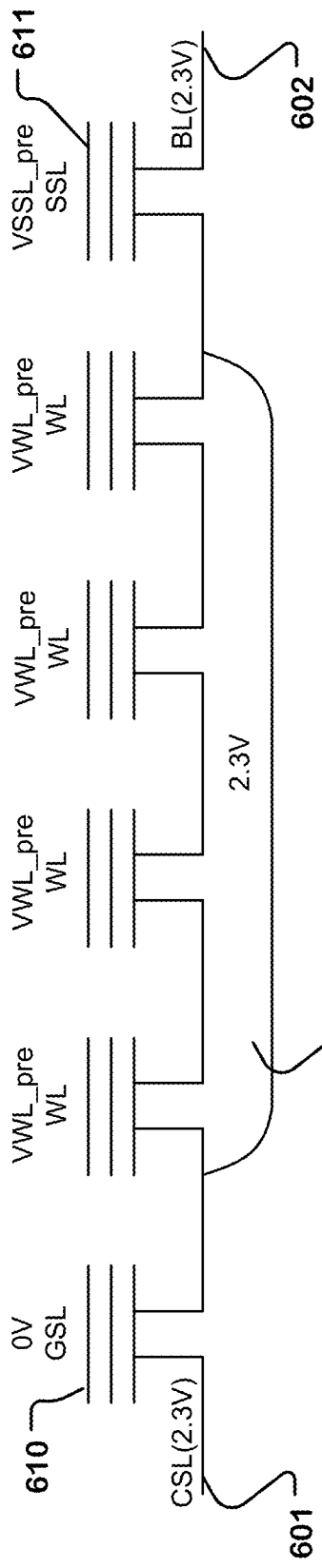
FIG. 6 is a heuristic illustration of a NAND string, in a stage of a precharge phase of the program operation of FIG. 5.

FIG. 6 illustrates an example condition of a NAND string in an unselected sub-block near the end of the interval T0. The NAND string is illustrated horizontally in this drawing, but can represent a vertical NAND string in embodiments like that of FIG. 4. At this point in time, the lower select gate 610 may have a gate voltage of 0 V, disconnecting the common source line 601 from the NAND string pillar. The string select gate 611 has a gate voltage VSSL_pre holding it in an on state, connecting the pillar to the bit line 602. As a result of the word lines and the string select gate being on, the semiconductor body of the memory cells in the body 605 is precharged to a level close to the bit line voltage (2.3 V in this example).

Figure 7:
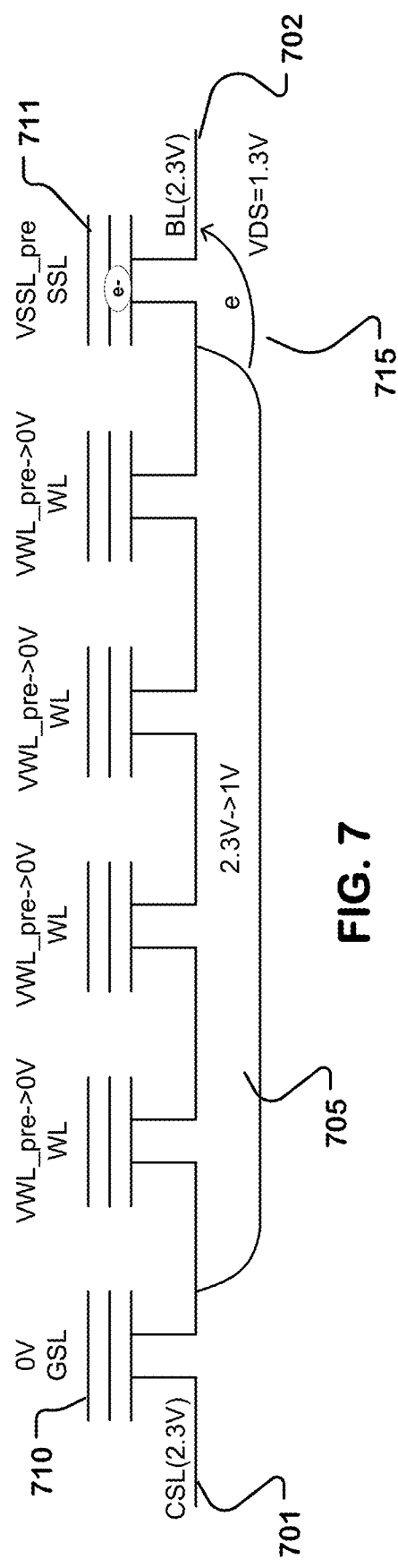
FIG. 7 is a heuristic illustration of a NAND string, in a stage after that of FIG. 6 of a precharge phase of the program operation of FIG. 5, showing select gate disturb conditions.

FIG. 7 illustrates the condition of the NAND string of FIG. 6 at the end of the interval T1 after the word line voltages drop before the string select voltage is lowered. At this point in time, the lower select gate 710 continues to have a gate voltage of 0 V, disconnecting the common source line 701, and the string select gate 711 continues to have a relatively high gate voltage of VSSL_pre. However, when the word line voltages fall from the precharge voltage VWL_pre to 0 V in this example, the voltage in the body 705 will be capacitively coupled lower as well. As a result of this lower voltage, a drain-to-source voltage VDS of about 1.3 V (for example) is established across the string select gate 711. Because the gate voltage remains relatively high, and the VDS accelerates electrons through the channel of the string select gate, hot electrons may be injected into the gate dielectric of the string select gate 711 (as indicated by the electron symbol). As mentioned above, the gate dielectric may have charge trapping dielectric layers, implemented like those of the memory cells, and can trap unwanted charge. This unwanted charge can increase the threshold voltage of the string select gate, and in extreme cases make the corresponding NAND string inoperable.

Figure 8:
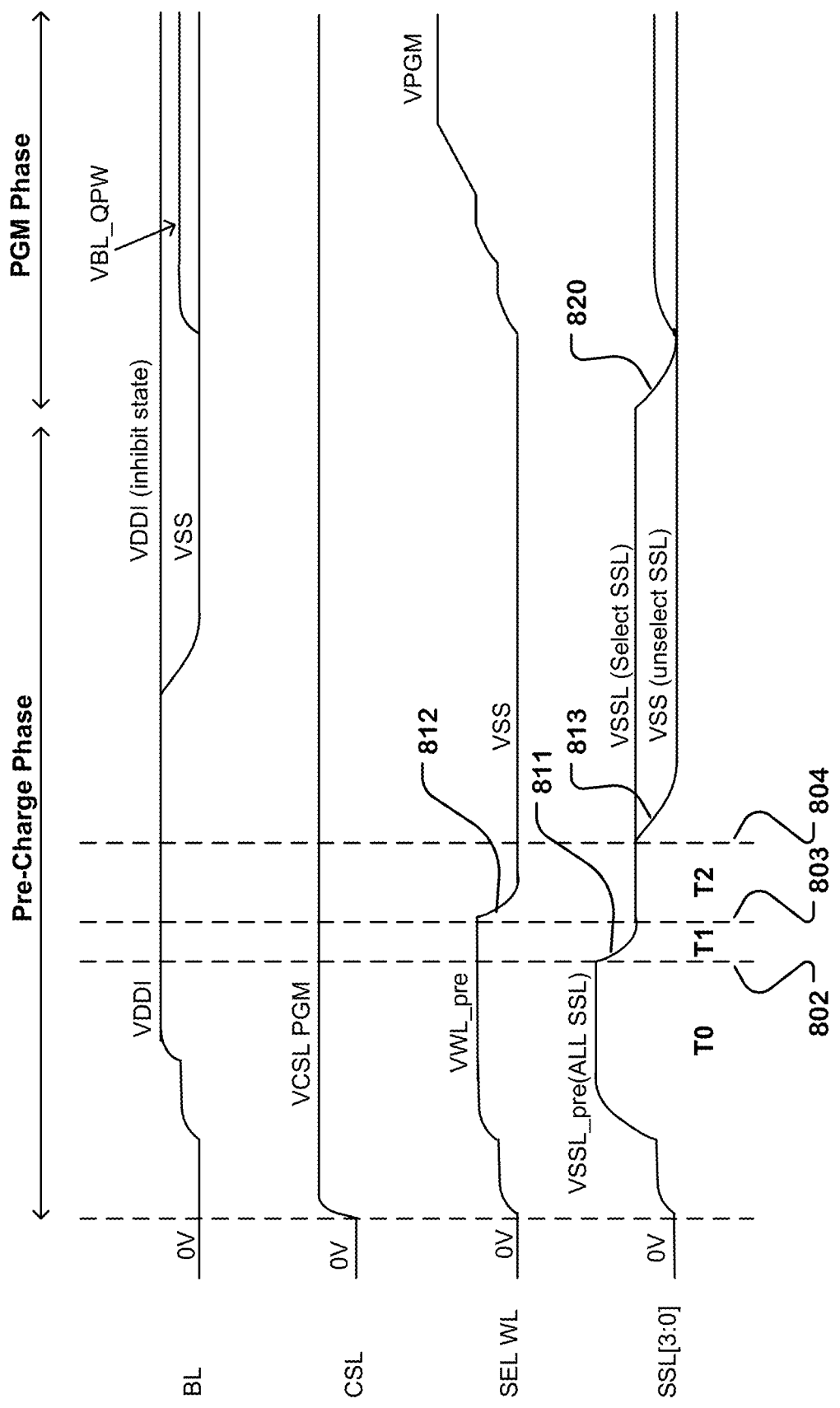
FIG. 8 is a timing diagram for a program operation on a NAND string, such as a NAND string in the circuit shown in FIG. 4, in a first embodiment which suppresses select gate disturb conditions.

FIG. 8 is a timing chart like that of FIG. 5 for a program operation in a block of memory cells such as that illustrated in FIG. 4, modified so as to suppress charge trapping in the string select gates. The voltages in FIG. 8 like those in FIG. 5 are not described again. However, the voltages differ in the intervals T0, T1 and T2.

Figure 10:
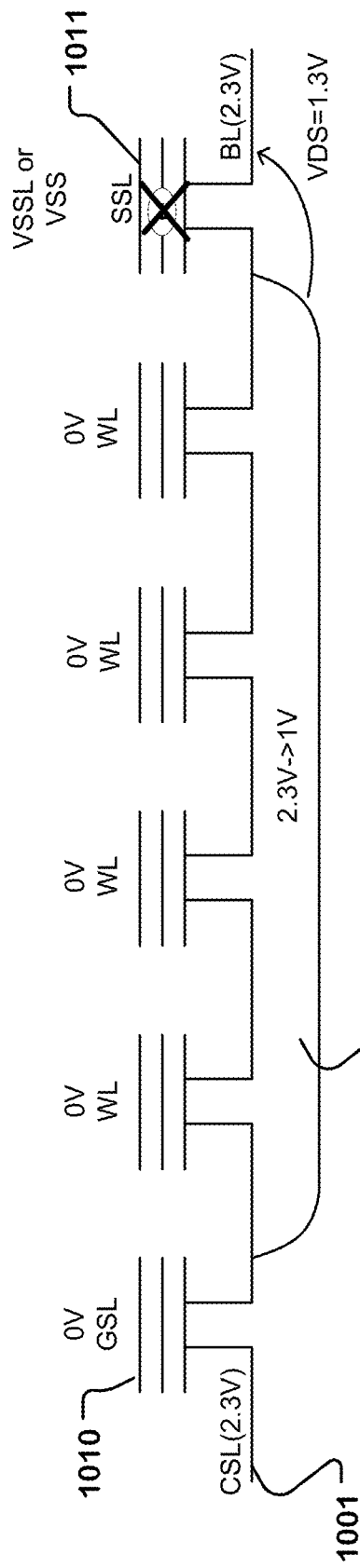
FIG. 10 is a heuristic illustration of a NAND string, in a stage after that of FIG. 6 of a precharge phase of the program operation of FIG. 5, showing suppressed select gate disturb conditions.

At the end of the interval T0 at time 802, the word line voltage on the selected word line remains at the precharge voltage level VWL_pre and the voltage on the string select lines remains at the precharge voltage level VSSL_pre. VWL_pre can be about 4V in this example, while VSSL_pre can be about 6V in this example, or high enough to support the precharge level desired for preventing program disturb of non-programmed, unselected sub-blocks. At time 802, the voltage on the string select lines of the selected block are all dropped as indicated at 811 from the relatively high VSSL_pre level to an intermediate voltage, which can be equal to or close to the voltage VSSL to be applied on the string select line for a selected sub-block after time 804. The intermediate voltage is a level that prevents injection of hot electrons to the gate dielectric of the string select gates when the word line voltages are dropped at time 803. At time 803, after interval T1, the word line voltage of the selected word line is dropped to VSS (812), after the voltage on the string select line has been lowered. As illustrated in FIG. 10, the lowered string select line voltage suppresses charge injection in the string select gate. At time 804, the voltage of the string select lines for the unselected sub-blocks is lowered to VSS (813), while the voltage on the string select line of the selected sub-block is maintained at VSSL, which should be higher than Vth of the string select gate, plus the program voltage level to be applied to a bit line to be programmed so as to pass that program voltage. Thereafter the precharge of the bit lines according to the data pattern and the program phase is executed. At the beginning of the program phase, the string select line for the selected sub-block is lowered as indicated at 820 from the precharge level to an initial level to be used in the programming phase for a selected sub-block.

The timing diagram of FIG. 8 illustrates an example of a program operation including applying a word line voltage at a precharge level to the group of word lines of a selected block, and a gate voltage having a first voltage level to all the sub-block string select lines in a selected block to precharge the set of NAND strings in the selected block, then lowering the gate voltage on all the sub-block string select lines of the block, and then lowering the word line voltages on the group of word lines; and after lowering the word line voltages on the group of word lines, applying a bias sequence to program selected memory cells in a selected sub-block, the bias sequence including setting the sub-block string select lines to a selected string level or an unselected string level, and setting the bit lines. In this example, lowering the gate voltage (811) on all the sub-block string select lines of the block includes setting the gate voltage to a level close to the selected string level (e.g. VSSL) as applied in the program phase. For the purposes of this description, the gate voltage is close to the selected string level if it is closer to the selected string level than to the unselected string level.

Figure 9:
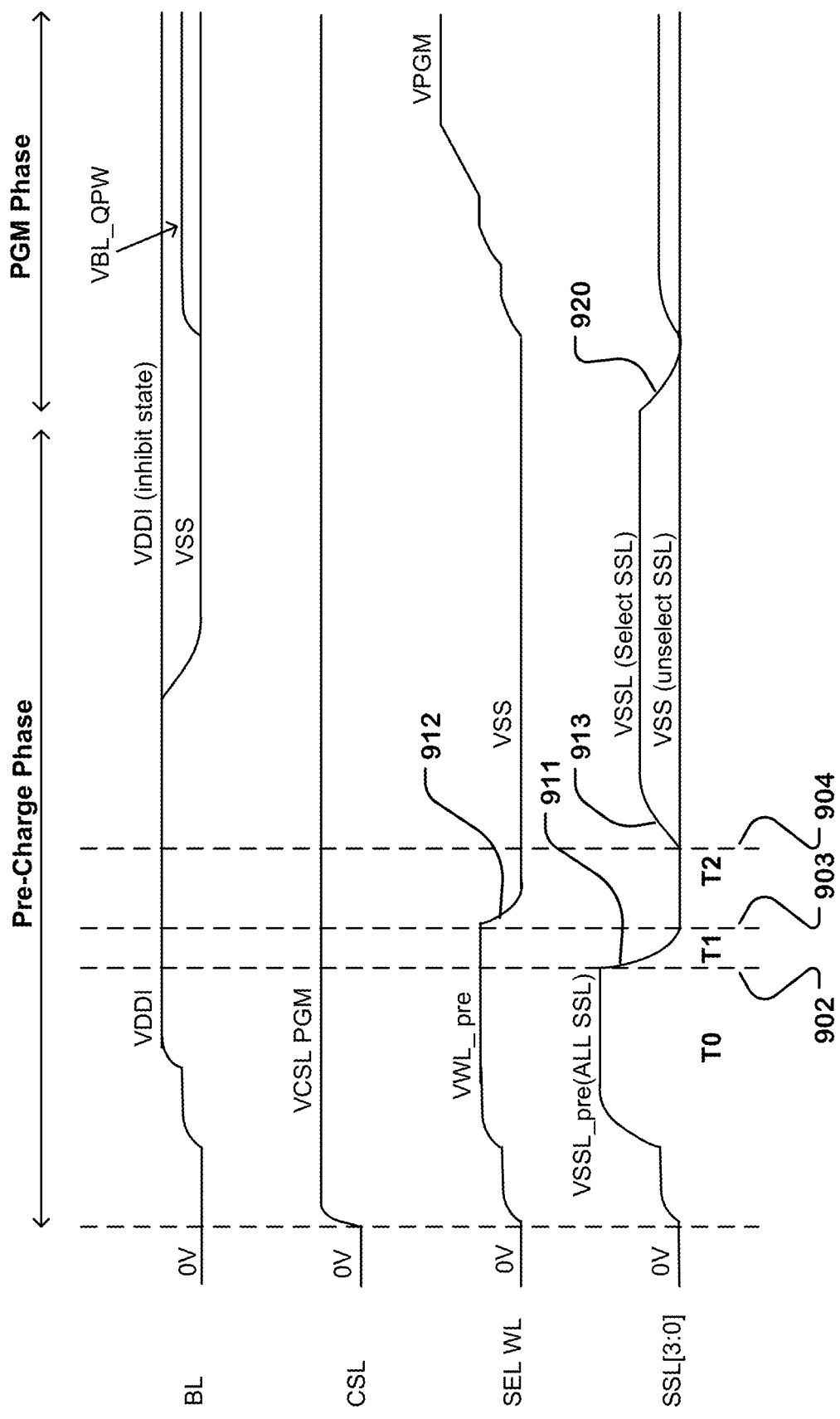
FIG. 9 is a timing diagram for a program operation on a NAND string, such as a NAND string in the circuit shown in FIG. 4, in a second embodiment which suppresses select gate disturb conditions.

FIG. 9 is a timing chart like that of FIG. 8 for an alternative program operation in a block of memory cells such as that illustrated in FIG. 4, modified so as to suppress charge trapping in the string select gates. The voltages in FIG. 9 like those in FIG. 5 are not described again. However, the voltages differ in the intervals T0, T1 and T2. Also, the voltages in FIG. 9 like those in FIG. 8 are not described again. However, the voltages differ in the intervals T1 and T2.

At the end of the interval T0 at time 902, the word line voltage on the selected word line remains at the precharge voltage level VWL_pre. At time 902, the voltage on the string select lines for all the sub-blocks of the selected block are dropped as indicated at 911 from the relatively high VSSL_pre level to a low level, which can be equal to or close to the voltage VSS applied on the string select line for unselected sub-block after time 904. At time 903 after interval T1, the word line voltage of the selected word line is dropped to VSS (912), after the voltage on the string select line has been lowered. As illustrated in FIG. 10, the lowered string select line voltage suppresses charge injection in the string select gate. At time 904, the voltage of the string select lines for the unselected sub-blocks is held to VSS, while the voltage on the string select line of the selected sub-block is increased to VSSL (913). Thereafter the precharge of the bit lines according to the data pattern and the program phase are executed.

The timing diagram of FIG. 9 illustrates another example of a program operation including applying word line voltages at precharge levels to the group of word lines of a selected block, and a gate voltage having a first voltage level to all the sub-block string select lines in a selected block to precharge the set of NAND strings in the selected block, then lowering the gate voltage on all the sub-block string select lines of the block, and then lowering the word line voltages on the group of word lines; and after lowering the word line voltages on the group of word lines, applying a bias sequence to program selected memory cells in a selected sub-block, the bias sequence including setting the sub-block string select lines to a selected string level or an unselected string level, and setting the bit lines. It this example, the lowering the gate voltage on all the sub-block string select lines of the block (911) includes setting the gate voltage to a level (e.g. VSS) close to the unselected string level as applied in the program phase. For the purposes of this description the gate voltage is close to the unselected string level if it is closer to the selected string level than to the selected string level.

FIGS. 8 and 9 illustrate embodiments of a program operation including:

a first stage (up to T0) to precharge the pillars in the plurality of pillars of the block to a precharge level including charging the word lines in the stack to word line precharge levels and the string select lines in the stack to string select line precharge levels;

a second stage (811, 812; 911, 912) to discharge the word lines in the stack, including reducing the voltages on the string select lines in the plurality of string select lines before reducing the voltages on the word lines in the stack;

a third stage (after T2) to set the voltage on a selected string select line for a selected sub-block, and to set the voltages on an unselected string select line for an unselected sub-block;

a fourth stage (before 820 or 920) to set the voltages on the bit lines in the plurality of bit lines according to a data pattern to be programmed in the selected sub-block; and a fifth stage (PGM Phase) to apply program voltages to program the data pattern in memory cells on the selected word line in the selected sub-block.

FIG. 10 illustrates the condition of the NAND string in an unselected sub-block (like that in FIG. 7) in the interval T2 of FIGS. 8 and 9, after the word line voltages drop while the string select voltage is low. At this point in time, the lower select gate 1010 continues to have a gate voltage of 0 V, disconnecting the common source line 1001, and the string select gate 1011 has a reduced gate voltage of VSSL or VSS in these examples. However, when the word line voltages fall from the precharge voltage VWL_pre to 0 V in this example, the voltage in the body 1005 will be capacitively coupled lower as well. As a result of this lower voltage, a drain-to-source voltage VDS of about 1.3 V is established across the string select gate 1011. Because the gate voltage is low, while the VDS accelerates electrons to the channel of the string select gate, the hot electrons will not be injected into the gate dielectric (as indicated by the "x" over the electron symbol) of the string select gate 1011. As mentioned above, the gate dielectric may have charge trapping dielectric layers, implemented like those of the memory cells, and can trap unwanted charge. This operation suppresses tunneling of unwanted charge into the string select gate, and improves performance and endurance of the memory device.

Figure 11:
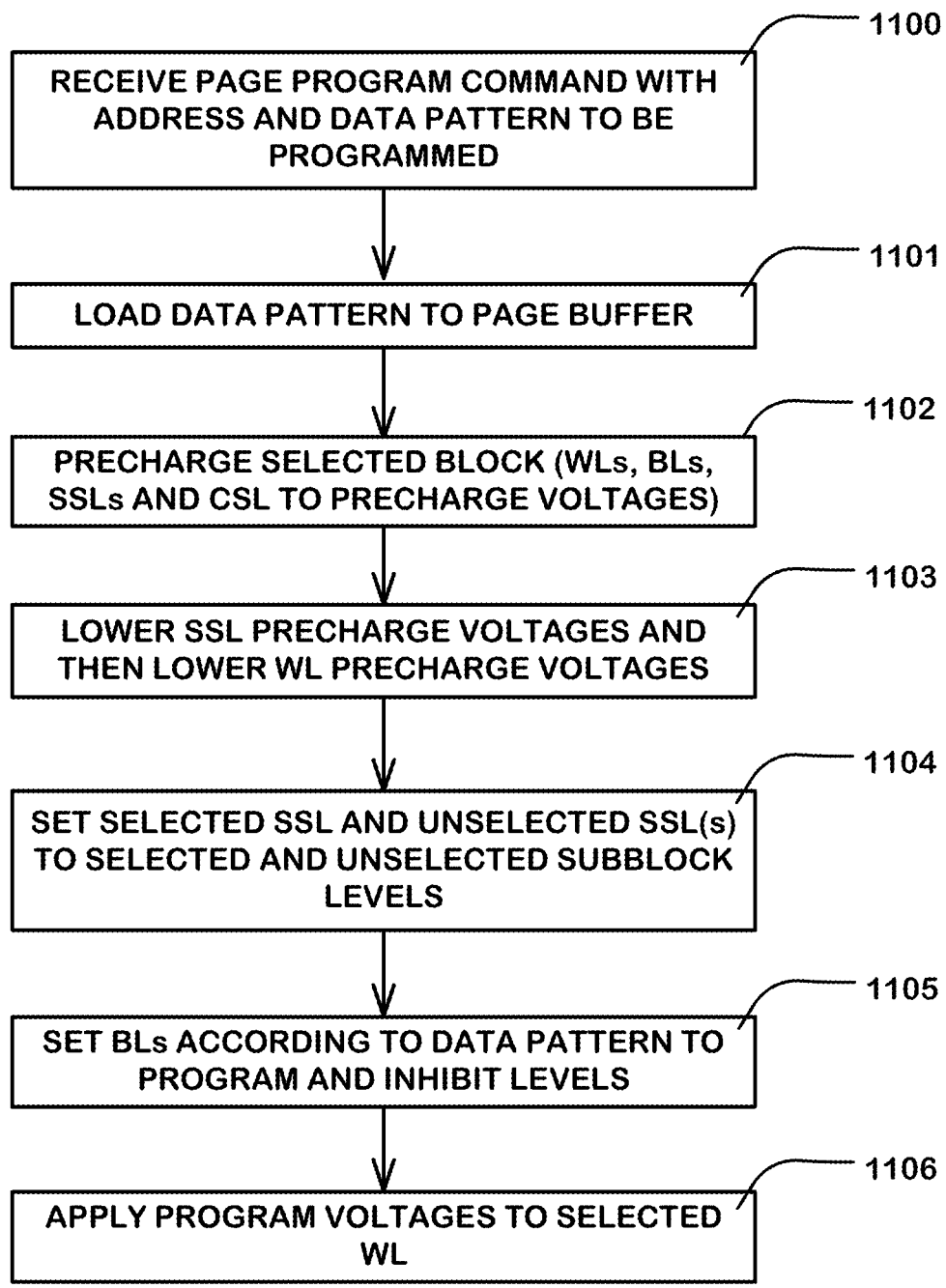
FIG. 11 is a flow chart of a program operation for a NAND string, with suppressed select gate disturb conditions.

FIG. 11 is a flow chart of a method of operating a memory device such as described herein, for a program operation. FIG. 11 is a flowchart for a method of operating a NAND memory including a plurality of blocks of memory cells arranged in NAND strings as described above, where each block includes a plurality of sub-blocks. Each of the sub-blocks includes a distinct subset of NAND strings.

In the embodiment illustrated, the method begins with receiving a page program command on an integrated circuit, where the command includes an address and a data pattern to be programmed (1100). The address will identify a selected block, a selected word line and a selected sub-block within the block. Circuitry on the integrated circuit loads the data pattern into a page buffer or other memory structure to be used during the programming (1101). The controller operates by circuitry on the chip to precharge the selected block, by setting the word line voltages, the bit line voltages, the string select line voltages, and the common source line voltages to precharge voltage levels (1102), examples of which are illustrated in FIG. 8 and FIG. 9. After an interval of time, the controller lowers the voltages on the string select lines in the block to an intermediate level or low level as illustrated in FIG. 8 and FIG. 9, respectively. Then the controller circuitry discharges the voltages on the word lines of the selected block (1103). At this point, the NAND strings in the selected block are precharged to prevent disturb of unselected NAND strings during the application of the program voltages. The controller then sets the voltages at the selected string select line, and the one or more unselected string select lines to selected sub-block (VSSL) and unselected sub-block (VSS) levels (1104). The bit line voltages are set to program and inhibit voltage levels according to the data pattern (1105). Also, program voltages are applied to the selected word line (1106).

FIG. 11 is a flow chart illustrating logic executed by the controller on the memory device described herein. The logic can be implemented using a controller as described with reference to FIG. 12. With all flowcharts herein, it will be appreciated that many of the steps can be combined, performed in parallel or performed in a different sequence without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions can be performed before, after and between those shown.

Figure 12:
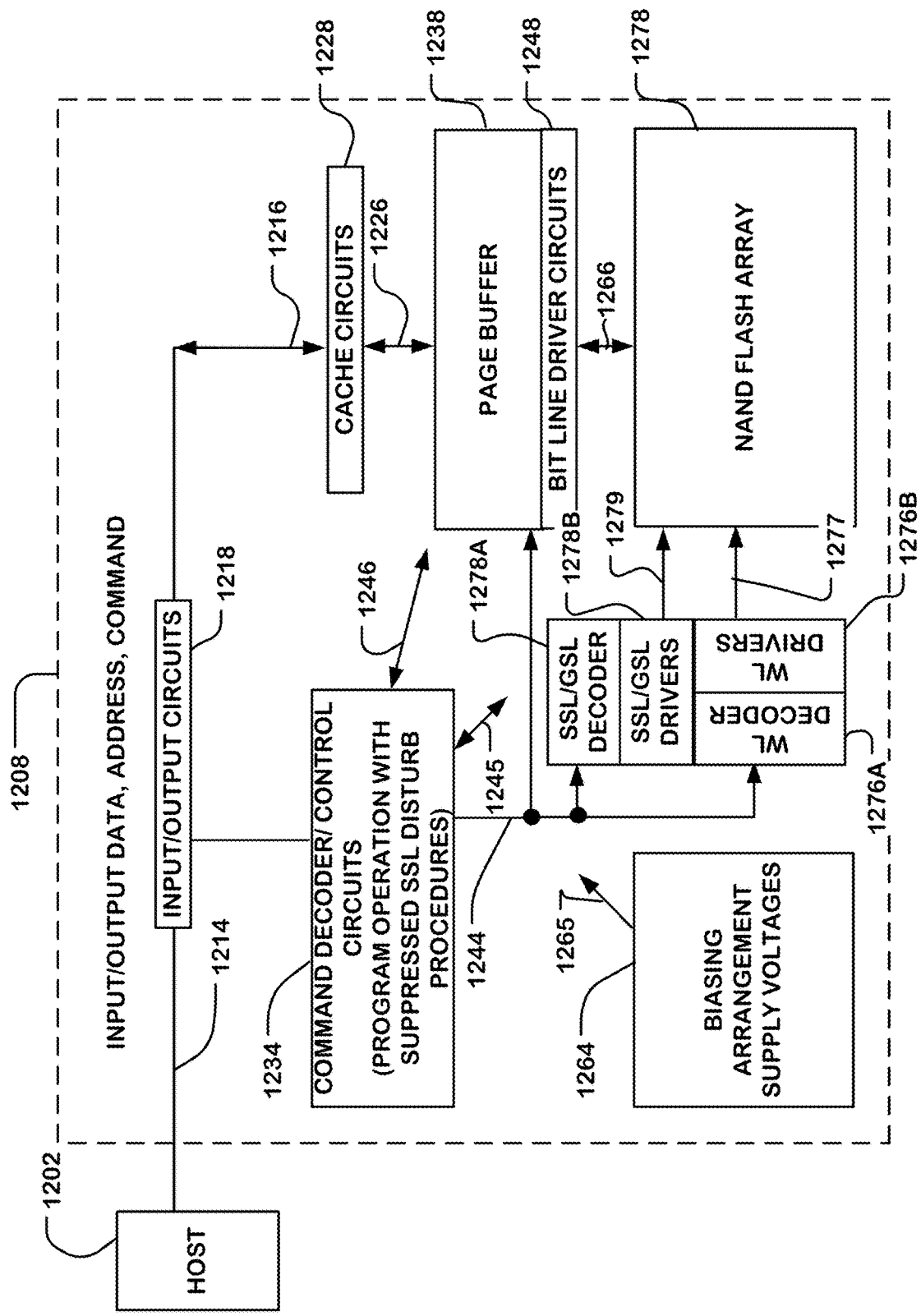
FIG. 12 is a simplified block diagram of an integrated circuit memory device, including a 3D vertical NAND array, and a control circuit to implement program operations with suppressed select gate disturb conditions.

FIG. 12 is a simplified diagram of a memory system including a flash memory device 1208 implemented on an integrated circuit and a host 1202 including logic for issuing commands such as program commands with addresses and data to be programmed. The memory device can be implemented on a single integrated circuit chip, on a multichip module, or on a plurality of chips configured as suits a particular need.

The memory device 1208 in this example includes a memory array 1278 including a plurality of blocks as described above, each having a plurality of sub-blocks, on an integrated circuit substrate. The memory array 1278 can be a NAND flash memory implemented using two-dimensional or three-dimensional array technology.

In various embodiments, the memory device 1208 may have single-level cells (SLC), or multiple-level cells storing more than one bit per cell (e.g., MLC, TLC or XLC).

The memory device 1208 includes a memory array 1278, which can be a NAND flash memory implemented using three-dimensional array technology. In some embodiments, the memory array 1278 comprises an array of vertical NAND strings in a dense 3D configuration. In other embodiments the memory array 1278 can comprise a two-dimensional array of NAND strings.

A word line decoder 1276A is coupled via word line driver circuits 1276B to a plurality of word lines 1277 in the memory array 1278. SSL/GSL decoder 1278A is coupled via SSL/GSL driver circuits 1278B by SSL and GLS lines 1279, to bit line side (SSL) and common source side (GSL) string select gates in the array. Page buffer circuits 1238 are coupled by bit line driver circuits 1248 to bit lines 1266 in the memory array 1278. In some embodiments, column decoder circuits can be included for routing data from the bit line drivers to selected bit lines. The page buffer circuits 1238 can store pages of data that define a data pattern for a page program operation, and can include sensing circuits used in read and verify operations Bit lines for memory arrays can comprise global bit lines (GBL) and local bit lines. Bit lines generally comprise conductors in higher patterned layers that traverse a plurality of blocks of memory cells in an array, and connect to local bit lines in the blocks via block select transistors or bank select transistors. The local bit lines are connected to the memory cells for current flow to and from the bit lines, which in turn are connected to the bit line driver circuits 1248 and page buffer circuits 1238. Likewise, the word lines can include global word lines and local word lines with corresponding supporting circuits in the word line drivers 1276B.

In a sensing operation, sensed data from the page buffer circuits 1238 are supplied via second data lines in bus system 1226 to cache circuits 1228, which are in turn coupled to input/output circuits 1218 via data path lines 1216. Also, input data is applied in this example to the cache circuits 1228 on links 1216, and to the page buffer circuits 1238 on bus system 1226, for use in support of program operations.

Input/output circuits 1218 are connected by link 1214 (including I/O pads) and provide communication paths for the data, addresses and commands with destinations external to the memory device 1208, including the host 1202 in this example. The input/output circuits 1218 provide a communication path by link 1216 to cache circuits 1228 which support memory operations. The cache circuits 1228 are in data flow communication (using for example a bus system 1226) with page buffer circuits 1238.

Control circuits 1234 are connected to the input/output circuits 1218, and include command decoder logic, address counters, state machines, timing circuits and other logic circuits that control various memory operations, including program, read, and erase operations for the memory array 1278. Control circuit signals are distributed to circuits in memory device, as shown by arrows 1245, 1246, as required to support the operations of the circuits. The control circuits 1234 can include address registers and the like for delivery of addresses as necessary to the components of the memory device 1208, including delivery to the cache circuits 1228, and on link 1244 to the page buffer circuits 1238, word line decoder 1276A and SSL/GSL decoder 1278A in this illustration.

In the example shown in FIG. 12, control circuits 1234 include control logic circuits that include modules implementing a bias arrangement state machine, or machines, which controls, or control, the application of bias voltages generated or provided through the voltage supply or supplies in block 1264, such as read, erase, verify and program voltages including precharge voltages, pass voltages and other bias voltages as described herein to word line driver circuits 1276B and bit line driver circuits 1248, for a set of selectable program and read operations. Bias voltages are applied as represented by arrow 1265, to components of the memory device 1208, as necessary for support of the operations. As described in more detail herein, the control circuits 1234 include logic to implement bias arrangements that mitigate production of hot electrons in channels of unselected NAND strings, such as by applying "pre-turn-on" bias between program verify pulses and program pulses of a program sequence.

The control circuits 1234 can include modules implemented using special-purpose logic circuitry including state machines, as known in the art. In alternative embodiments, the control circuits 1234 can include modules implemented using a general-purpose processor, which can be implemented on the same integrated circuit, which execute a computer program to control the operations of the memory device 1208. In yet other embodiments, a combination of special-purpose logic circuitry and a general-purpose processor can be utilized for implementation of modules in control circuits 1234.

The flash memory array 1278 can comprise floating gate memory cells or dielectric charge trapping memory cells configured to store multiple bits per cell, by the establishment of multiple program levels that correspond to amounts of charge stored, which in turn establish memory cell threshold voltages Vt. The technology can be used with single-bit-per-cell flash memory, and with other multiple-bit-per-cell and single-bit-per-cell memory technologies. In other examples, the memory cells may comprise programmable resistance memory cells, phase change memory cells, and other types of non-volatile and volatile memory cell technologies.

In the illustrated example, the host 1202 is coupled to links 1214 on the memory device 1208, as well as other control terminals not shown, such as chip select terminals and so on, and can provide commands or instructions to the memory device 1208. In some examples, the host 1202 can be coupled to the memory device using a serial bus technology, using shared address and data lines. The host 1202 can comprise a general purpose processor, a special purpose processor, a processor configured as a memory controller, or other processor that uses the memory device 1208. All or part of the host 1202 can be implemented on the same integrated circuit as the memory.

The host 1202 can include a file system or file systems that store, retrieve, and update data stored in the memory based on requests from an application program. In general, the host 1202 can include programs that perform memory management functions. Such functions can include for example wear leveling, bad block recovery, power loss recovery, garbage collection, error correction, and so on. Also, the host 1202 can include application programs, file systems, flash translation layer programs and other components that can produce status information for data stored in the memory, including issuing commands to program data having addresses and data to be programmed.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A NAND memory device, comprising:
a plurality of blocks of memory cells and a plurality of bit lines, each block including a group of word lines, and a set of NAND strings having string select gates for connection to corresponding bit lines in the plurality of bit lines, and in which each NAND string in the set of NAND strings of the block is connected to the group of word lines;
each block in the plurality of blocks of memory cells having a plurality of sub-blocks, each sub-block including a distinct subset of the set of NAND strings of the block, the distinct subset of NAND strings in each sub-block being operatively connected to a respective sub-block string select line by which gate voltages are applied to the string select gates of the NAND strings in the distinct subset of the sub-block; and
control circuits configured to execute a program operation for the plurality of blocks, the program operation including:
applying word line voltages at a precharge level to the group of word lines of a selected block, and a gate voltage having a first voltage level to all the sub-block string select lines in a selected block to precharge the set of NAND strings in the selected block, then lowering the gate voltage on all the sub-block string select lines of the block, and then lowering the word line voltages on the group of word lines; and
after lowering the word line voltages on the group of word lines, applying a bias sequence to program selected memory cells in a selected sub-block, the bias sequence including setting the sub-block string select lines to a selected string level or an unselected string level, and setting the bit lines.

2. The memory device of claim 1, wherein said reducing the voltages on the string select lines in the second stage, includes setting the voltages on the string select lines to a level close to the voltages set in the third stage to the selected string select line.

3. The memory device of claim 1, wherein said reducing the voltages on the string select lines in the second stage, includes setting the voltages on the string select lines to a level close to the voltages set in the third stage to the unselected string select line.

4. The memory device of claim 1, wherein one bit line in the plurality of bit lines is connected to the string select gate for only one NAND string in each sub-block of a given block.

5. The memory device of claim 4, wherein the bias sequence to program the selected memory cells includes setting bit lines in the plurality of bit lines at a program voltage level or an inhibit voltage level according to a data pattern to be programmed, and thereafter applying a program voltage level to a selected word line in the group of word lines of the selected block.

6. The memory device of claim 1, wherein the string select gates in the block have charge trapping dielectric layers.

7. The memory device of claim 1, wherein the memory cells in the block and the string select gates on the NAND strings in the block have charge trapping dielectric layers.

8. The memory device of claim 1, wherein the NAND strings in the block are arranged vertically relative to a substrate, and the plurality of bit lines overlie the NAND strings.

9. A memory device, comprising:
a memory block comprising a stack of word lines and a plurality of pillars oriented orthogonally to the stack of word lines, wherein the memory block comprises memory cells located at cross-points between pillars in the plurality of pillars and word lines in the stack;
a plurality of string select lines, each of the string select lines intersecting a respective sub-block of the block, each sub-block having distinct subset of pillars in the plurality of pillars, each of the intersections of a pillar and a string select line defining a respective string select gate of the pillar;
a plurality of bit lines oriented orthogonally relative to the plurality of pillars, and operatively connected to the string select gates of one pillar in each of the distinct subsets of pillars;

one or more reference lines coupled to the plurality of pillars, the plurality of memory cells of the block of memory cells being arranged in a plurality of NAND strings between the plurality of bit lines and the one or more references lines;

the memory block including a plurality of sub-blocks of memory cells, each of the sub-blocks including memory cells located at cross-points between pillars in the respective distinct subsets of pillars and the word lines in the stack of word lines;

control circuits arranged to apply bias voltages to the bit lines in the plurality of bit lines, the word lines in the stack of word lines, and the string select lines in the plurality of string select lines for a program operation to program memory cells on a selected word line in the stack of word lines in a selected sub-block of memory cells in the plurality of sub-blocks, the program operation including:

a first stage to precharge the pillars in the plurality of pillars of the block to a precharge level including charging the word lines in the stack to word line precharge levels and the string select lines in the stack to string select line precharge levels;

a second stage to discharge the word lines in the stack, including reducing the voltages on the string select lines in the plurality of string select lines before reducing the voltages on the word lines in the stack;

a third stage to set the voltage on a selected string select line for a selected sub-block, and to set the voltages on an unselected string select line for an unselected sub-block;

a fourth stage to set the voltages on the bit lines in the plurality of bit lines according to a data pattern to be programmed in the selected sub-block; and a fifth stage to apply program voltages to program the data pattern in memory cells on the selected word line in the selected sub-block.

10. The memory device of claim 9, including one or more second select lines, each of the pillars in the plurality of pillars intersecting a second select line of the one or more second select lines, each of the intersections of a pillar and a string select line defining a respective second select gate of the pillar operatively connecting the pillars to the one or more reference lines.

11. The memory device of claim 9, wherein said reducing the voltages on the string select lines in the second stage includes setting the voltages to a level close to the selected string level.

12. The memory device of claim 9, wherein said reducing the voltages on the string select lines in the second stage includes setting the gate voltage to a level close to the unselected string level.

13. The memory device of claim 9, wherein the string select gates in the block have charge trapping dielectric layers.

14. The memory device of claim 9, wherein the memory cells in the block and the string select gates on the NAND strings in the block have charge trapping dielectric layers.

15. A method of operating a NAND memory including a plurality of blocks of memory cells arranged in NAND strings, each block including a plurality of sub-blocks including distinct subsets of the NAND strings in the block, comprising:

applying word line voltages at a precharge levels to a selected block in the plurality of blocks, and a gate voltage having a first voltage level to all the sub-block string select lines in a selected block to precharge the set of NAND strings in the selected block;

discharging the word line voltages by first lowering the gate voltage on all the sub-block string select lines of the block, and then lowering the word line voltages on the group of word lines; and after lowering the word line voltages, applying a bias sequence to program selected memory cells in a selected sub-block, the bias sequence including setting the sub-block string select lines to a selected string level or to an unselected string level, and setting bit lines.

16. The method of claim 15, wherein said lowering the gate voltages on all the sub-block string select lines of the block includes setting the gate voltages to a level close to the selected string level.

17. The method of claim 15, wherein said lowering the gate voltages on all the sub-block string select lines of the block includes setting the gate voltages to a level close to the unselected string level.

18. The method of claim 15, wherein said setting the bit lines includes setting bit lines in the plurality of bit lines at a program voltage level or an inhibit voltage level according to a data pattern to be programmed, and the method further includes after setting the bit lines applying a program voltage level to a selected word line in the group of word lines of the selected block.

* * * * *